(12) United States Patent
Williamson

(10) Patent No.: US 6,239,637 B1
(45) Date of Patent: May 29, 2001

(54) METHOD AND APPARATUS FOR TRANSMITTING AN ELECTRICAL SIGNAL FEATURING PULSE EDGE COMPRESSION

(75) Inventor: John M. Williamson, Stittsville (CA)

(73) Assignee: Nortel Networks Limited, Montreal (CA)

( * ) Notice: Subject to any disclaimer, the term of this patent is extended or adjusted under 35 U.S.C. 154(b) by 0 days.

(21) Appl. No.: 09/471,322

(22) Filed: Dec. 23, 1999

(51) Int. Cl.[7] ................................................. H03K 5/12
(52) U.S. Cl. ................................. 327/170; 327/134
(58) Field of Search ................................. 327/170, 134, 327/172

(56) References Cited

U.S. PATENT DOCUMENTS 5,378,939 * 1/1995 Maraland et al ........................ 327/91

* cited by examiner

Primary Examiner—Toan Tran
Assistant Examiner—Cassandra Cox

(57) ABSTRACT

A signal transmission device including an input for receiving an input electrical signal containing a succession of pulses. The input signal has a high data rate, preferably in excess of 10 gigabits per second. The signal is split in two identical specimens, referred to as first signal and second signal and injected in respective channels of a lossy transmission path whose function is to carry the signals to an intended destination. Before introducing the second signal in the respective channel of the lossy signal transmission path, a negative DC shift is applied to the second signal. During the transmission of the first and the second signals through the lossy signal transmission path, they are subjected to distortions that cause the leading and the trailing edges of pulses in the signals to spread out. To compensate for this distortion, the first and the second signals are processed at the destination by first and second functional units that comprise non-linear signal transmission paths. The first functional unit effects compression of the leading edge of the pulses in the first signal while the second functional unit effects compression of the trailing edges of pulses in the second signal. The outputs of the functional units are combined into one signal containing the pulses from the input signal but substantially free of the distortions introduced by the lossy signal transmission path.

29 Claims, 4 Drawing Sheets

METHOD AND APPARATUS FOR TRANSMITTING AN ELECTRICAL SIGNAL FEATURING PULSE EDGE COMPRESSION

FIELD OF THE INVENTION

The present invention relates to a method and to an apparatus for processing an electrical signal to compress the leading and the trailing edges of pulses contained in the electrical signal. The invention finds practical applications in systems where electrical signals are transmitted at high data rates over printed circuit boards or connectors mounted to the printed circuit board. During the transmission, electrical signals are susceptible to attenuation, harmonic distortion and dispersion, among others, that cause inter-symbol interference. The method and the apparatus provided by the present invention compensate for the distortion allowing a reliable use of high data rate transmissions over electrical interconnects.

BACKGROUND OF THE INVENTION

Modern large-scale electronics such as telecommunication or computing systems are usually comprised of many interconnected shelves of processing, access and/or memory modules. The processing, access and memory functions are usually provided by modules that plug into a large printed circuit board (PCB) referred to as a backplane. (BP) or midplane (MP) located behind the modules. Duo to the huge quantities of data available for processing and storage there is a need for ever-increasing data rates on the modules and BPs. With the advent of synchronous optical networks (SONET), telecommunication and computer systems may be linked together by optical fibres that terminate on the module faceplates. Usually, in order to make use of the data carried by the optical fibre, the module must convert the signals to electrical pulses and demultiplex (demux) them to many slower speed data streams. The highest widely used optical data rate is 10 gigabits per second (OC192). Currently, such a data stream is often demuxed by a factor of 16 or even 64 to get 16 622 megabits per second or 64 155 megabits per second streams. This level of demuxing contributes greatly to the complexity of the electro-optic and processing/switching modules and the routing density on the PCBs. In addition, the power requirements of the demux and mux units can be significant.

The industry has recognized that it is desirable to allow electrical signals at a data rate exceeding 10 gigabits per second to be transmitted over standard copper interconnect. If this could be made possible, elctro-optic modules would not require a demux function at all since the electrical signal would also be at 10 gigabits per second. Furthermore, the routing and processing hardware would be made simpler since only a fraction of the currently existing I/Os and tracks would be needed.

The principal reason that commercially available 10 gigabits per second electrical interconnect does not already exist is that the standard BP and BP connectors possess too high a level of parasitic inductance, capacitance, resistance and conductance. These result in attenuation, harmonic distortion and dispersion (to name a few) to an extent that makes sufficiently error-free transmission of data virtually impossible.

SUMMARY OF THE INVENTION

In one aspect, the present invention provides an electrical signal transmission device, comprising an input for receiving an input electrical signal containing a succession of pulses, each pulse including a leading edge and a trailing edge, The electrical signal transmission device includes a lossy transmission pathway for conveying the pulses in the input electrical signal, the lossy transmission pathway being susceptible to induce distortions in the pulses such that the leading edges and the trailing edges of the pulses elongate and become spread over respective time intervals. The lossy transmission pathway is coupled to a signal processing unit whose function is to process the pulses to reduce the time intervals over which the leading and the trailing edges of pulses are spread. The signal processing unit releases an output signal containing the pulses of the input signal.

The advantage of this signal transmission device resides in its ability to compensate for the pulse distortion particularly at the leading and at the trailing edges that occurs when electrical signals at high data rates are sent over conductors on a printed circuit board OL connectors mounted to printed circuit boards. Accordingly, this invention is particularly useful in the context of electrical signal transmission at high data rates, such as equal or in excess of 10 gigabits per second over copper interconnects. It should be noted, however, that the inventive principle is not limited to this context of utilization, as the invention may also find applications in other contexts or environments.

In a specific nonlimiting example of implementation, tile lossy transmission pathway comprises two signal channels implemented over a printed circuit board and including copper conductors and/or electrical connectors. The channels convey identical signals with the exception that one of the signals is DC shifted negatively by a magnitude that is approximately equal to the peak voltage level of the signal. The signal processing unit of the signal transmission device includes two functional units, namely a first functional unit and a second functional unit. One of the channels of the lossy transmission pathway is connected to the first functional unit while the other channel is connected to the second functional unit. The first functional unit is operative to compress the leading edge of pulses in the input signal by passing the signal through a non-linear signal transmission path. The non-linear signal transmission path is characterized by a signal propagation delay dependent upon an absolute value of the voltage level in the signal. The parts of the signal that are at a relatively high voltage are delayed less than the parts of the signal that are at a relatively low voltage. For example, the leading edge of a pulse has a relatively low voltage bottom segment that ramps-up to a relatively high voltage top segment. The high voltage top segment is transmitted faster through the non-linear signal transmission path than the low voltage bottom segment. This behavior compensates for spreading of the leading edge induced in the signal by the copper interconnects as a result of attenuation, harmonic distortion and dispersion, among others.

The second functional unit of the pulse edge compression device is responsible for compressing the trailing edge of the pulses in the signal that is DC negatively shifted. The purpose of the negative DC shifting of the signal is to transform the low voltage regions of the signal into high voltage regions (in absolute value terms) This has the effect of changing the behavior of the non-linear propagation path of the second functional unit comparatively to the first functional unit in that edge compression is effected on the trailing edge rather than on the leading edge.

Therefore, the output of the first functional unit is a signal containing a succession of pulses where the leading edges of those pulses have been compressed and the trailing edges of the pulses are expanded. The opposite signal structure is present at the output of the second functional unit. More particularly, the leading edges of the pulses are expanded while the trailing edges of the pulses are compressed. The output signals of the functional units are passed through respective high pass filters that remove the low-frequency elements from the signals leaving only the high frequency elements. Since the compressed pulse edges are made up mostly of high frequency components, the signals released from the high pass filters include a succession of short pulses, where each short pulse corresponds to a leading edge or to a trailing edge of a pulse in the input signal. The output signals from the high pass filters are combined to reconstitute the pulses from the input signal. Specifically, the output signals are combined to produce a train of short positive and negative pulses, which correspond to the rising and falling edges of the input signal.

The invention also provides a method for transmitting an electric signal containing pulses. Further, the invention provides a printed circuit board with the signal transmission device broadly described above.

In a different aspect, the invention also provides a pulse shaping device that has a first input for receiving a first electrical signal containing a succession of pulses, each pulse including a leading edge spread over a certain time interval, and a second input for receiving a second electrical signal containing a succession of pulses, each pulse including a trailing edge spread over a certain time interval. A signal processing unit is coupled to the first and to the second inputs, the signal processing unit being operative to:

(i) process the first electrical signal to reduce the time interval over which the leading edges of the pulses in the first electrical signal are spread;

(ii) process the second electrical signal to reduce the time interval over which the trailing edges of the pulses in the second electrical signal are spread;

(iii) combine the processed first and second electrical signals to provide an output signal containing pulses, each pulse in the output signal having a leading edge derived from a leading edge of a pulse from the processed first electrical signal and a trailing edge derived from a trailing edge of a pulse from the processed second electrical signal.

DETAILED DESCRIPTION

Figure 1:
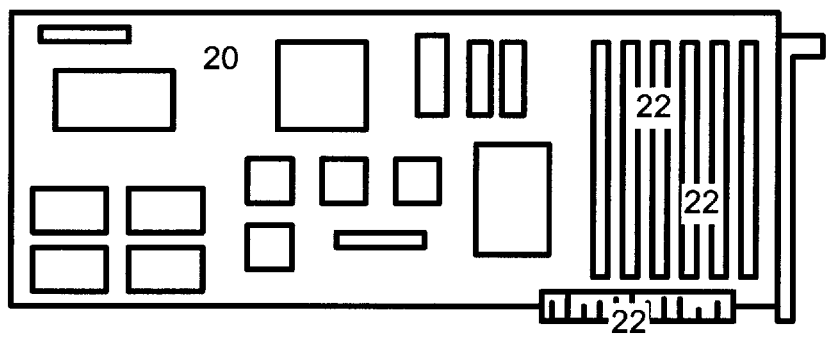
FIG. 1 is a schematical view of a printed circuit board in which the signal transmission device according to the invention can be used.

FIG. 1 is a schematical view of a printed circuit board 20. The printed circuit board 20 includes an insulating substrate over which are laid thin copper conductors to allow electrical signals to propagate between various components mounted on the printed circuit board 20. The printed circuit board 20 is designed to connect to external components through electrical connectors 22.

Due to skin-effect and dielectric loss whose effects are square-root proportional and directly proportional to frequency respectively, typical copper-based interconnect on the printed circuit board 20 causes significant attenuation and dispersion (time-domain spreading) of the digital pulses at signal frequencies exceeding 1 Gigahertz (GH). This pulse spreading, in turn, can result in inter-symbol interference (ISI) which refers to the phenomenon where portions of pulses overlap one another in the time-domain.

Figure 3:
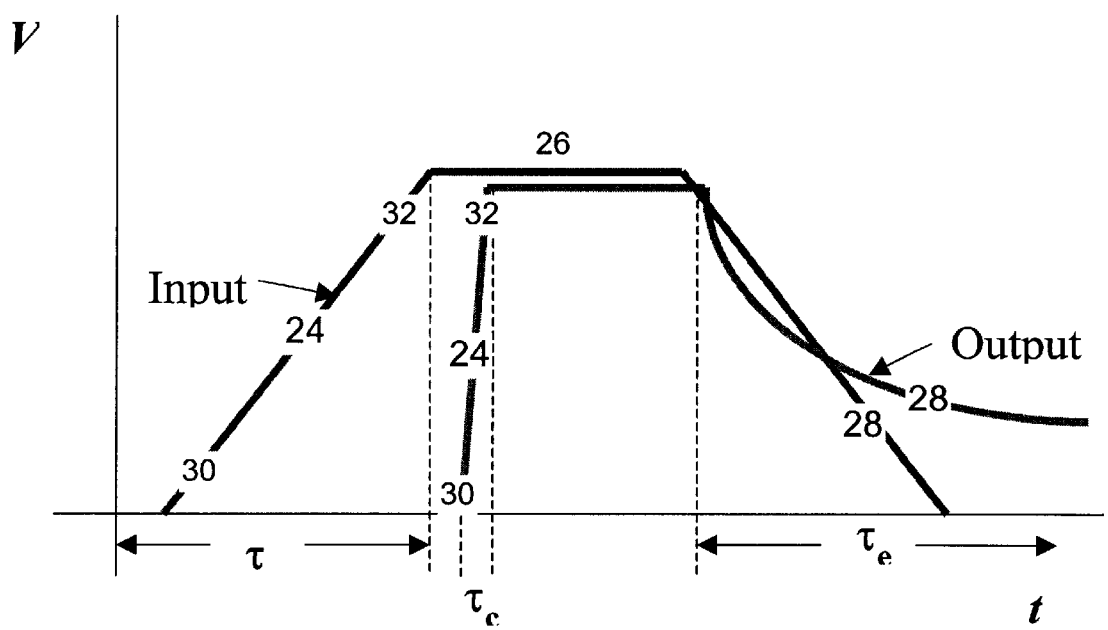
FIG. 3 illustrates the shape of a pulse in the input signal that has suffered pulse edge spreading and the shape of the same pulse when processed in a non-linear transmission line that has the effect of compressing the leading edge and further spreading the trailing edge.

The graph of FIG. 3 labeled "Input" illustrates generally the kind of distortions a pulse in the input signal is subjected to. The pulse has a leading edge 24 a plateau segment 26 and a trailing edge 28. The leading edge has a bottom segment 30 that is further away (in the terms of time) with respect to the top segment 32 of the leading edge 24. This means that the leading edge 24 is spread over a certain time interval The trailing edge 28 of the pulse is subjected to the same type of distortion as described with relation to the leading edge 24.

Ideally, the time interval $\tau$ should be 0. The larger the distortion the larger the time interval $\tau$ becomes. Beyond a certain level of distortion, the edges in adjacent pulses of the input signal will start to overlap which renders the data decoding operation impossible or very difficult to perform at best.

Figure 2:
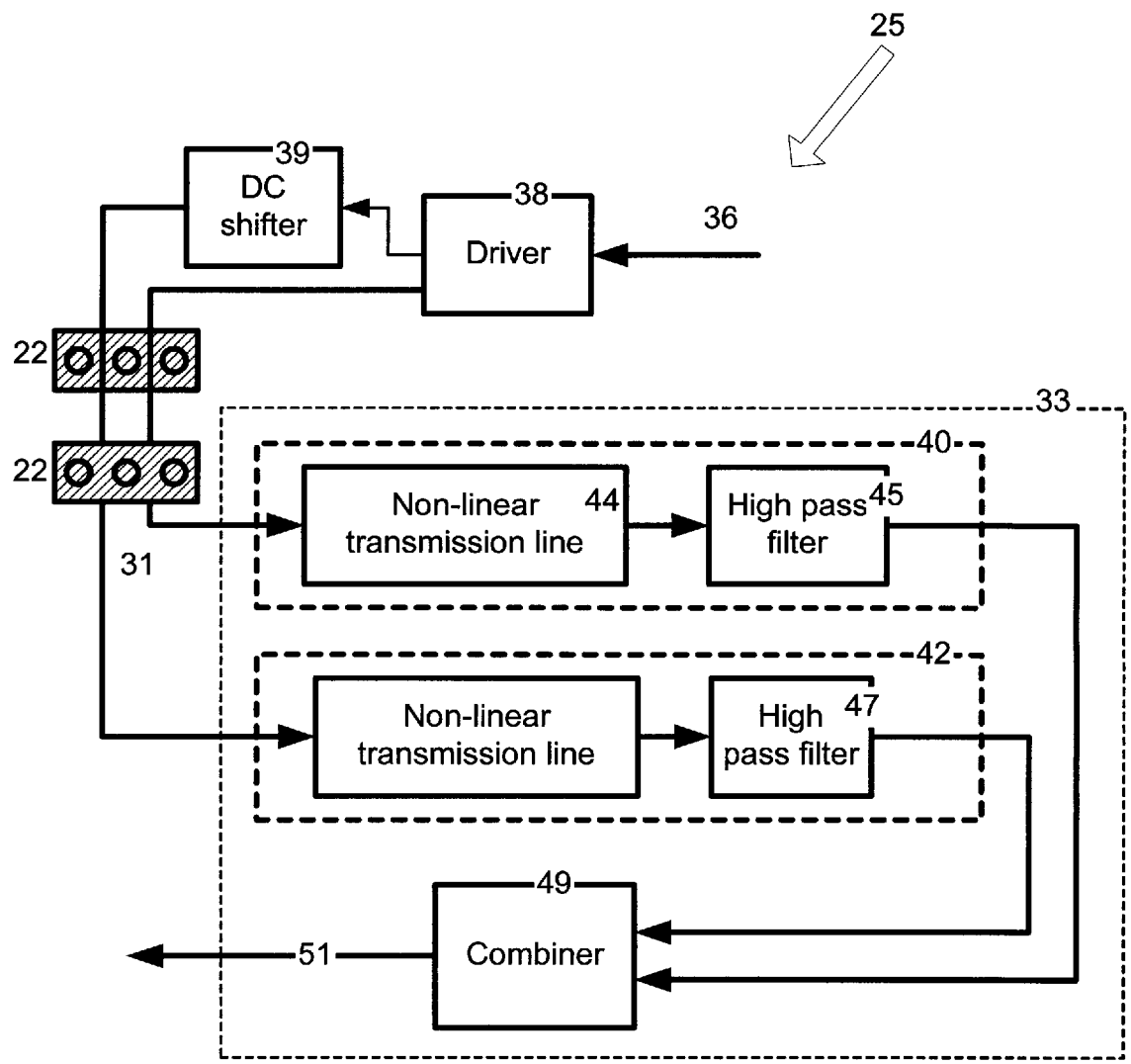
FIG. 2 is a circuit diagram of the signal transmission device constructed according to a nonlimiting example of implementation of the present invention.

FIG. 2 illustrates the diagram of a signal transmission device 25 designed to allow electric signals to propagate at high data rates. More particularly, the signal transmission device 25 can effect edge compression on pulses that have been distorted as shown in FIG. 3 during the transmission. Such compression compensates the pulse edge spreading and makes the data recovery operation easier to perform even when the signal is sent at high data rates, such as equal to or in excess of 10 gigabits per second. The electrical input signal to be processed by the pulse edge compression unit 33 is applied to an input 36 that connects to a driver 38. The driver 38 features a dual output that releases identical signals. Each of the signals released by either output of the driver 38 is identical to the input signal applied to the input 36. One of the signals is then supplied to DC shifter 39 that adds to the signal a negative direct current voltage value that preferably is equal to the peak voltage level of the signal. In essence this has the effect of shifting the pulses in the signal below the zero voltage line such that at any point in time the signal has a negative value. For the remaining of this description, the DC shifted signal will de designated as the "negative signal" while the other signal will be designated as the "positive signal".

The negative and the positive signals are injected in a lossy transmission path 31 over two separate channels. The lossy transmission path is the actual facility over which signal transmission takes place. Its length will vary according to the intended application. In a specific example of implementation, the lossy transmission path 31 includes copper strips formed by etching on the printed circuit board 20. Alternatively, the lossy transmission path 31 includes connectors 22 allowing external components to be connected to printed circuit board 20.

During the transmission of the positive and negative signals in the lossy transmission path 31, the pulses in the signals are subjected to distortion as described earlier which has the effect of extending the time intervals over which the leading and the trailing edges of the pulses are spread.

The lossy transmission path 31 is coupled to a pulse edge compression unit 33 that compensates for the pulse edge distortion. The pulse edge compression unit 33 includes two functional units, namely a first functional unit 40 and a second functional unit 42. The channel of the lossy transmission path 31 that conveys the positive signal is connected to the first functional unit 40, while the channel conveying the negative signal is coupled to the second functional unit 42. The purpose of the first functional unit 40 is to perform compression on the leading edge of the pulses in the positive signal while the purpose of the second functional unit 42 is to perform edge compression on the trailing edges of the pulses in the negative signal.

Figure 9:
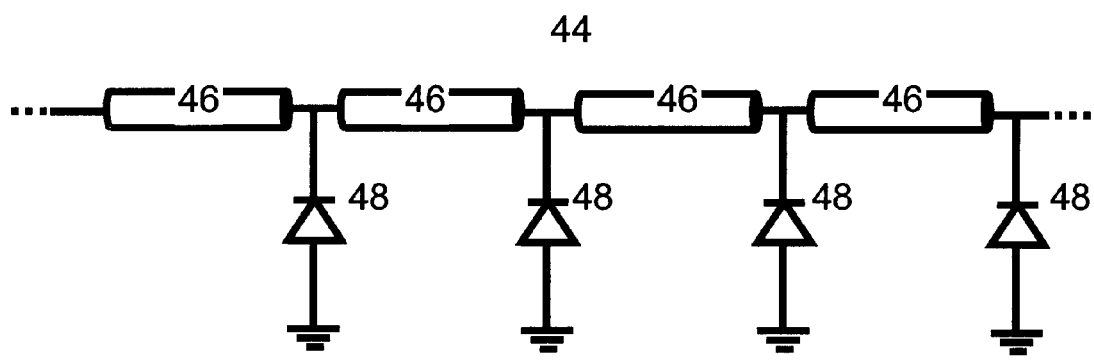
FIG. 9 is a circuit diagram of the non-linear transmission path signal transmission device depicted in FIG. 2.

The first functional unit comprises a non-linear transmission line 44 that reduces the time interval $\tau$ over which the leading edge 24 is spread. A specific example of implementation of the non-linear transmission line 44 is depicted in FIG. 9. The non-linear transmission line 44 comprises one or more (usually dozens) ordinary transmission line sections 46 augmented by reverse biased diodes 48.

The propagation delay $t_{pd}$ of an ordinary transmission line is given by $$t_{pd} = \sqrt{LC} \quad (1)$$

where L and C are the per unit inductance and capacitance of the transmission line. However, the equation must be modified in the case where diodes are present. In this case the propagation $t_D$ delay is given by $$t_D = \sqrt{L(C+C_D)} \quad (2)$$

where $C_D$ is the reverse-biased diode capacitance. The diode capacitance is, in turn, a function of the voltage across the diode and can be expressed by $$C_D = \frac{C_{J0}}{\left(1 - \frac{V_D}{\phi}\right)^\gamma} \quad (3)$$

where $C_{J0}$ is the zero-bias voltage capacitance of the pn-junction, $V_D$ is the diode voltage (will be negative due to reverse biasing), $\Phi$ is a process constant which is usually in the range of 0.5 to 1.0, and $\gamma$ is the doping profile of the pn-junction. Usually, $\gamma$ is equal to about 0.5 but for hyper-abrupt junction (varactor) diodes, $\gamma$ may be as high as 2. In this case, pulse edge compression has been observed tor $0.5 < \gamma < 1.2$.

The non-linear transmission line 44 behaves unilaterally, that is it causes pulse edge compression to occur on one edge or the other (leading or trailing edge) but not both. For example, the trapezoidal pulse shown in FIG. 3 with leading and trailing edges 24, 28 is applied to the input of the structure in FIG. 9. The output waveform will ire similar to the one labeled "Output" shown in FIG. 3.

From (3) it is clear that $C_D$ is a function of voltage $V_D$ across the diode. From (2) it is also apparent that through (3) the propagation delay is also dependent on $V_D$. This means that as the pulse ramps tip during $\tau_o$, the bottom segment 30 of the leading edge 24 propagates more slowly than the top segment 32 allowing the top to "catch up" which causes the output waveform to appear as it does on the leading edge of the "Output" waveform. In other words, the leading edge 24 is compressed by virtue of a reduction of the time interval $\tau$. When the waveform begins to return to zero, the capacitance now begins to increase resulting in the long fall-time. Again, the top segment of the trailing edge propagates faster than the bottom segment that causes the time interval over which the trailing edge is spread to increase $\tau_e$.

The second functional unit 42 also includes a non-linear transmission line that in one possible example of implementation could be made very similar to the example depicted in FIG. 9 with the exception that the diodes 48 are oriented in the opposite direction on account of the negative voltage levels in the negative signal. For the negative signal, the pulse edge compression occurs on the trailing edge, while edge elongation occurs on the leading edge.

The positive and the negative signals are then terminated in the average impedances of the non-linear transmission paths 44 that are given by:

$$Z_0 = \sqrt{\frac{L_0}{C_0 + C_{av}}} \quad (4)$$

where $L_0$ and $C_0$ are the intrinsic inductance and capacitance respectively of the line and $C_{av}$ is defined by $$C_{av} = \frac{1}{V_{SW}} \int_0^{V_{SW}} C_D \, dV_D \quad (5)$$

where $C_D$ is defined in (3), $V_D$ is the voltage across the diode and $V_{SW}$ is the level of the DC voltage shift effected by the DC voltage shifter 39.

As previously mentioned, the magnitude of the DC shift performed by the DC shifter 39 is preferably equal to the peak voltage in the input signal. This creates a situation where efficient compression in the trailing pulse edge is accomplished because the top segment of the pulse edge that is at the 0 voltage level propagates as slowly as possible (the value $C_D$ is then equal to $C_{J0}$ in equation 3). As $V_D$ increases toward the bottom segment of the trailing pulse edge, the propagation delay is redlined since the factor $C_D$ diminishes ($C_D$ is Lien less than $C_{J0}$). In order to achieve a high level of compression at the trailing pulse edge the important consideration is not the absolute propagation delay at the top segment or at the bottom segment of the trailing pulse edge but the differential in the propagation delay between the top segment and the bottom segment. What is desired for an efficient compression is to achieve the highest propagation delay differential. In a situation where the DC shift will be more than the peak voltage in the signal, which implies that the top segment of the DC negatively shifted signal will be below the 0 volt level, it can be demonstrated through equation 3 that the amount of compression will be less than the situation where the top segment is at the 0 voltage level. This is because the relationship between $V_D$ and $C_D$ is not linear. More particularly, for the same difference between a base line voltage $V_{D0}$ and a higher voltage (in absolute terms) level $V_{D1}$, $C_D$ will vary less with increasing $V_{D0}$ values. Accordingly, the propagation delay differential will vary less also.

It should be noted that although it is preferred that the DC negative shift be about equal to the peak voltage level in the signal, the present invention is not limited to this characteristic as embodiments where the DC negative shift is other than equal to the peak voltage level in the signal are clearly within the scope of the invention.

After the termination resistors, each functional unit is provided with a high-pass filter 45, 47. The high pass filter 45, 47 could be a capacitor or a non-contact coupler. The high pass filter 45, 47 is positioned so that the slowly varying leading edge in the positive signal and the slowly varying trailing edge in the negative signal are removed.

Figure 4:
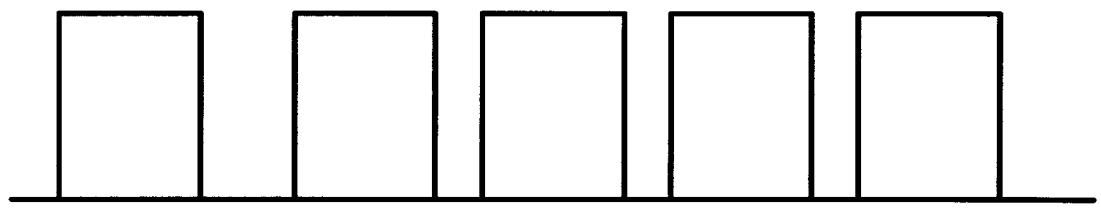
FIG. 4 is a graph illustrating the general structure of the input signal input to the signal transmission device according to the invention.
Figure 5:
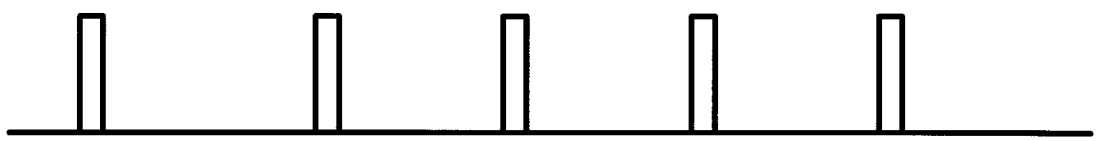
FIG. 5 is a graph illustrating the structure of the signal output the first functional unit of the pulse edge compression device that forms part of the signal transmission device depicted in FIG. 2.
Figure 6:
FIG. 6 is a graph illustrating the structure of the signal output by the second functional unit of the signal transmission device depicted in FIG. 2, the graphs in FIGS. 5 and 6 being in alignment with the graph in FIG. 4 to illustrate the registration between the pulse edges in FIG. 4 and the pulses in FIGS. 5 and 6.
Figure 7:
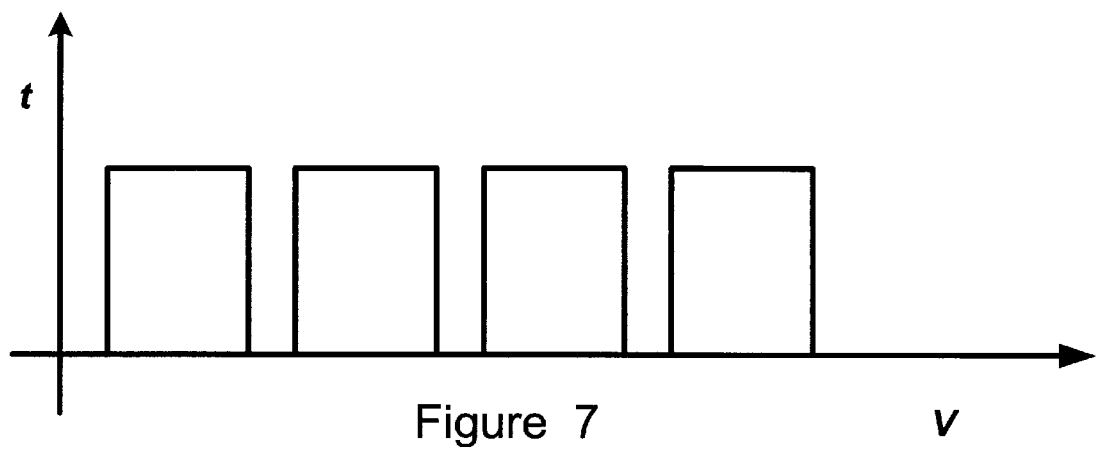
FIG. 7 is a graph that illustrates the general appearance of a pulse in the input signal before being processed by the first functional unit of the signal transmission device depicted in FIG. 2.
Figure 8:
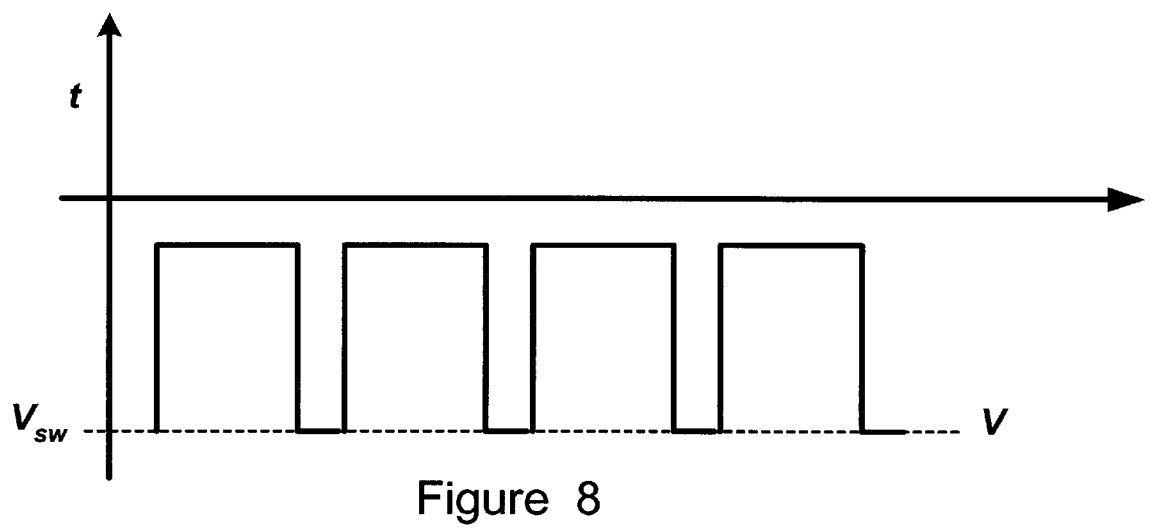
FIG. 8 is a graph that illustrates the general appearance of a pulse in the input signal immediately after it has been subjected to a DC shift and before it is processed to perform edge compression.

The relationship between the filtered positive signal, negative signal and the input signal is shown in FIGS. 4, 5 and 6. The filtered positive signal is shown in FIG. 5. This signal forms a series of positive pulses that correspond to leading edges of pulses in the input signal shown in FIG. 4. The filtered negative signal is shown in FIG. 6. This signal forms a series of negative pulses that correspond to trailing edges of pulses in the input signal. Referring back to FIG. 2, the filtered positive and negative signals are then supplied to a third functional block including a combiner 49 whose function is to sum the signals (such as a power combiner or any other suitable signal adder) and then reconstruct the original pulse train. The combiner 49 is a component well known to those skilled in the art and does not need to be described in detail here. The original pulse train that constitutes the output signal 51 is reconstructed by integration and amplification, both functions being performed by the combiner 49 following the summing of the two signals. The integration and amplification techniques are well known to a person skilled in the art and do not need to be described in detail here.

It is intended that the present application covers the modifications and variations of this invention provided that they come within the scope of the appended claims and their equivalents.

I claim:

1. A pulse edge compression device, comprising:
    a first input for receiving a first electrical signal containing a succession of pulses, each pulse including a leading edge spread over a certain time interval;
    a second input for receiving a second electrical signal containing a succession of pulses, each pulse including a trailing edge spread over a certain time interval;
    a signal processing unit coupled to the first and to the second inputs, the signal processing unit being operative to;
    a) process the first electrical signal to reduce the time interval over which the leading edges of the pulses in the first electrical signal are spread;
    b) process the second electrical signal to reduce the time interval over which the trailing edges of the pulses in the second electrical signal are spread;
    c) combine the processed first and second electrical signals to provide an output signal containing pulses, each pulse in the output signal having a leading edge derived from a leading edge of a pulse from the processed first electrical signal and a trailing edge derived from a trailing edge of a pulse from the processed second electrical signal;
    d) release the output signal.

2. A pulse edge compression device as defined in claim 1, wherein the first and the second electrical signals are transmitted over a printed circuit board.

3. A pulse edge compression device as defined in claim 1, wherein the first and the second electrical signals are transmitted through a printed circuit board connector.

4. A pulse edge compression device as defined in claim 2, wherein said signal processing unit includes a first functional unit and a second functional unit, each said functional unit defining a propagation path for pulses in the input signal, said first functional unit being operative to process the first electrical signal to reduce the Lime interval over which are spread the leading edges of pulses in the first electrical signal, said second functional unit being operative to process the second electrical signal to reduce the time interval over which are spread the trailing edges of pulses in the second electrical signal.

5. A pulse edge compression device as defined in claim 4, wherein said first and second functional units include non-linear signal transmission paths.

6. A pulse edge compression device as defined in claim 5, wherein each non-linear signal transmission path is characterized by a signal propagation delay that is dependent upon an absolute value of a voltage level of the electrical signal transmitted through the non-linear signal transmission path.

7. A pulse edge compression device as defined in claim 6, wherein each non-linear signal transmission path is characterized by a capacitance that varies in accordance with an absolute value of a voltage level of the electrical signal transmitted through the non-linear signal transmission path.

8. A pulse edge compression device as defined in claim 7, wherein each non-linear signal transmission path includes at least one reverse biased diode.

9. A pulse edge compression device as defined in claim 6, wherein the second electrical signal manifests a DC voltage shift with respect to the first electrical signal.

10. A pulse edge compression device as defined in claim 9, wherein the DC voltage shift is a negative DC voltage shift.

11. A pulse edge compression device as defined in claim 10, wherein the DC voltage shift has a magnitude that is equal to an absolute value of a peak voltage level in the second signal.

12. A pulse edge compression device as defined in claim 11, wherein the DC voltage shift has a magnitude that is equal to a magnitude of pulses in the second input signal.

13. A pulse edge compression device as defined in claim 10, wherein each said functional unit includes a high pass filter downstream of the non-linear transmission path with relation to the propagation path.

14. A pulse edge compression device as defined in claim 13, comprising a third functional unit coupled to said first and to said second functional units for processing signals output by the respective high pass filters of said first and second functional units, said third functional unit being operative to combine the signals output by the respective high pass filters to generate the output signal.

15. A pulse edge compression device as defined in claim 14 wherein the first and the second electrical signals have a data rate of not less than about 10 gigabits per second.

16. A printed circuit board comprising the pulse edge compression device defined in claim 1.

17. A signal transmission device, comprising:
    an input for receiving an input electrical signal containing a succession of pulses, each pulse having a leading edge and a trailing edge;

a lossy signal transmission path coupled to said input for transporting said signal, said lossy signal transmission path being susceptible to induce distortions in the pulses such that the leading and the trailing edges of pulses elongate and become spread over respective time intervals;
   a) signal processing unit coupled to said lossy signal transmission path for receiving pulses in which distortions have been induced by said lossy signal transmission path, said signal processing unit being operative to reduce the time interval over which the leading edges and the trailing edges of the pulses are spread and generate an output signal with pulses in which the leading and the trailing edges are spread over a shorter time interval by comparison to pulses received by said signal processing unit from said lossy signal transmission path;
   b) an output coupled to said signal processing unit or releasing the output signal.

18. A signal transmission device as defined in claim 17, wherein said lossy signal transmission path is formed on a printed circuit board.

19. A signal transmission device as defined in claim 18, wherein said lossy signal transmission path includes a copper conductor formed on a printed circuit board.

20. A signal transmission device as defined in claim 18, wherein said lossy signal transmission path includes an electrical connector mounted on a printed circuit board.

21. A signal transmission device as defined in claim 17, further including a driver coupled to said input, said driver including a dual output for generating a first signal and a second signal derived from the input signal applied to said input, said first and said second signal including pulses.

22. A signal transmission device as defined in claim 21, wherein said lossy signal transmission path includes first and second channels coupled to respective outputs of said driver for conveying the first and the second signals, respectively.

23. A signal transmission device as defined in claim 22, comprising a DC shifter coupled to said driver for adding a DC voltage to the second signal before introducing the second signal in the respective channel of said lossy signal transmission pathway.

24. A signal transmission device as defined in claim 23, wherein the DC voltage has a magnitude equal to a peak voltage level of the second signal.

25. A signal transmission device as defined in claim 24 wherein the DC voltage is a negative DC voltage.

26. A signal transmission device as defined in claim 25, wherein said signal processing unit includes a first functional unit and a second functional unit, said first functional unit being coupled to said lossy signal transmission path and receiving the first signal to process the first signal to reduce the time interval over which are spread the leading edges of pulses in the first signal, said second functional unit being coupled to said lossy signal transmission path and receiving the second signal to process the second signal to reduce the time interval over which are spread the trailing edges of pulses in the second signal.

27. A pulse edge compression device as defined in claim 26, wherein said first and second functional units include non-linear signal transmission paths.

28. A pulse edge compression device, comprising:
   first input means for receiving a first electrical signal containing a succession of pulses, each pulse including a leading edge spread over a certain time interval;
   second input means for receiving a second electrical signal containing a succession of pulses, each pulse including a trailing edge spread over a certain time interval;
   signal processing means coupled to the first and to the second input means, said signal processing means being operative to:
     a) process the first electrical signal to reduce the time interval over which the leading edges of the pulses in the first electrical signal are spread;
     b) process the second electrical signal to reduce the time interval over which the trailing edges of the pulses in the second electrical signal are spread;
     c) combine the processed first and second electrical signals to provide ain output signal containing pulses, each pulse in the output signal having a leading edge derived from a leading edge of a pulse from the processed first electrical signal and a trailing edge derived from a trailing edge of a pulse from the processed second electrical signal;
     d) release the output signal.

29. A method for processing a signal, said method comprising:
   receiving an electrical signal containing a succession of pulses, each pulse including a leading edge and a trailing edge, the leading edge and the trailing edges being spread over respective time intervals;
   processing the input signal to reduce the time intervals over which the leading and the trailing edges of the pulses in the input signal are spread;
   releasing the signal processed by the signal processing unit.

\* \* \* \* \*